WILLIAM S. AUGUST
INVENTOR.

BY Fraser and Bogucki
ATTORNEYS

Aug. 4, 1964 W. S. AUGUST 3,143,592

HEAT DISSIPATING MOUNTING STRUCTURE FOR SEMICONDUCTOR DEVICES

Filed Nov. 14, 1961 2 Sheets-Sheet 2

WILLIAM S. AUGUST
INVENTOR.

BY Fraser and Bogucki

ATTORNEYS 3,143,592

HEAT DISSIPATING MOUNTING STRUCTURE FOR SEMICONDUCTOR DEVICES

William S. August, Altadena, Calif., assignor to Inland Electronics Products Corporation, Pasadena, Calif., a corporation of California Filed Nov. 14, 1961, Ser. No. 152,340
3 Claims. (Cl. 174—15)

This invention relates generally to units for mounting semiconductor devices, and more particularly to a mounting structure for dissipating the heat generated by the operation of semiconductor devices.

It has long been recognized that the efficiency of a semiconductor device such as a transistor or diode decreases with increasing temperature. Additionally, the operating characteristics of many semiconductors vary appreciably over the temperature range of operation so that the performance will begin to deteriorate to a degree rendering the devices unusable for many purposes long before such a temperature causing complete failure has been reached.

Therefore, it is desirable to cool a semiconductor device and to maintain consistent its operating temperature to assure reliable operation. If efficient means are provided for dissipating the heat generated during the operation of a semiconductor device, the device may be operated at higher power levels with a general increase in the efficiency of the device and of the circuit of which the device forms a part.

Various arrangements have been suggested in the past for cooling semiconductor devices. For example, a heat sink may be employed to dissipate the heat generated by the operation of the semiconductor device. A heat sink normally comprises a large metallic plate adapted to mount a semiconductor and to conduct away the heat generated by its operation. A heat sink is generally not efficient enough, however, to limit the temperature to a desirable range and may be useless when a number of devices are operated in such close physical relationship that insufficient space is available for heat dissipation. The operation of a heat sink may be improved by the forced circulation of air about the heat sink. While this procedure permits lowering the temperature of the semiconductor appreciably, it requires the expenditure of additional power for circulating the air and, in some instances, for cooling the air. Further, in many applications the additional space necessary for the equipment required for forced air circulation is unavailable.

Thus, the problem of maintaining semiconductor devices at relatively low and constant temperatures, slightly above ambient temperatures, is extremely difficult when a number of semiconductor devices are arranged in close physical association. On the other hand, if the heat generated during the operation of a semiconductor device can be efficiently dissipated, a large number of devices may be arranged in a given physical space.

Accordingly, it is an object of the present invention to provide an improved mounting structure for semiconductor devices which will efficiently dissipate the heat generated during the operation of the devices.

Another object of the present invention is to provide a heat-dissipating mounting structure which requires no additional power to remove the heat generated by the operation of the semiconductor devices.

A further object of the present invention is to provide a mounting structure for semiconductor devices which permits the positioning of the devices in a plurality of adjacent layers with sufficient clearance for interconnection and other circuit components and also permits the efficient dissipation of the heat generated when the devices are in operation.

An additional object of this invention is to provide a semiconductor heat-dissipating mount which is of a size and shape adaptable to compact and miniature circuit arrangements.

In accordance with the present invention there is provided a mounting plate of thermally-conductive material, such as a metal, for supporting one or more semiconductor devices. In order to dissipate the heat generated by the semiconductor device, a conduit is thermally coupled to the mounting plate. This may, for example, be effected by providing substantially-parallel hollow extensions on the plate which are interconnected by tubes. The hollow extensions and tubes are filled with a material, such as Freon, which is liquid at a temperature slightly below the selected operating temperature of the devices and vaporizes at the operating temperature or slightly above the operating temperature. As the liquid vaporizes, it effectively draws off the heat from the mounting plate and the semiconductor. The tubes have a portion disposed away from and above the mounting plate in which the vapor rises and collects. The vapor is then condensed by heat exchange with the atmosphere away from the semiconductor device, and the liquid returns to receive heat from the operating device. Preferably, the vapor-collecting portions of the tubes are provided with thermally-conductive fins to improve the heat exchange between the vapor in the tube and the atmosphere.

These and other objects of the present invention will be more apparent from the following detailed description, taken in connection with the accompanying drawings, wherein like elements are designated by the same or primed reference characters, and in which.

Figures 1, 4:
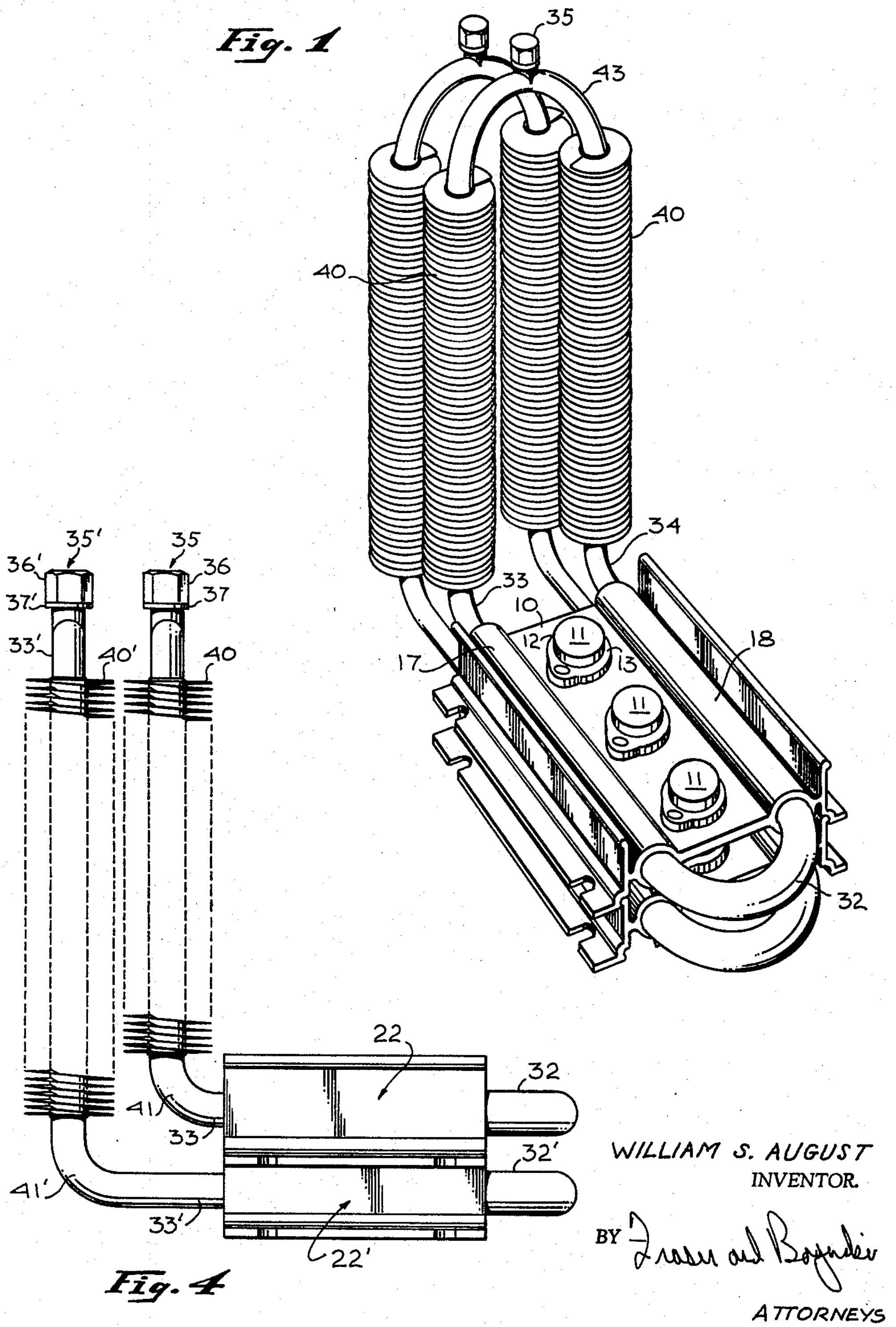
FIG. 1 is a perspective view of an embodiment of the present invention showing three transistors disposed thereon.
FIG. 4 is a side-elevational view of the structure of FIG. 1 illustrating the heat exchanger tubes.

Referring now to the drawings, there is illustrated a heat-dissipating transistor mounting structure in accordance with the present invention comprising a mounting plate 10. The mounting plate 10 is constructed of a heat-conducting material such as metal. The mounting plate may consist of copper or of aluminum (aluminum may be anodized to provide a tarnish-resisting surface finish). As shown particularly in FIGS. 1–3 a plurality of transistors 11, for example three, may be disposed in varying positions as desired on the mounting plate 10. As illustrated, each of the transistors 11 may have a cylindrical body 12, a larger cylindrical base portion 13 which is adapted to provide a large heat-dissipation surface, and two pins 14 and 15 which are the emitter and collector connections. The emitter and collector pins 14 and 15 may extend through suitable openings in the mounting plate 10. It will be appreciated that semiconductor devices of other shapes may be mounted in a similar manner.

In accordance with the present invention the mounting plate 10 is provided with two parallel hollow extensions 17 and 18 disposed on the sides of the transistors 11. The extensions or hollow tubes 17 and 18 may be made integral with the mounting plate 10 or may be thermally coupled thereto. As shown particularly in FIG. 3, the extensions 17 and 18 are each provided with a bore 20 for receiving a hollow tube. In addition, a bore 21 may be provided at the lower end of the extensions 17 and 18 for receiving a hollow tube somewhat larger than that received by the bore 20 thereby providing a reservoir.

Figure 3:
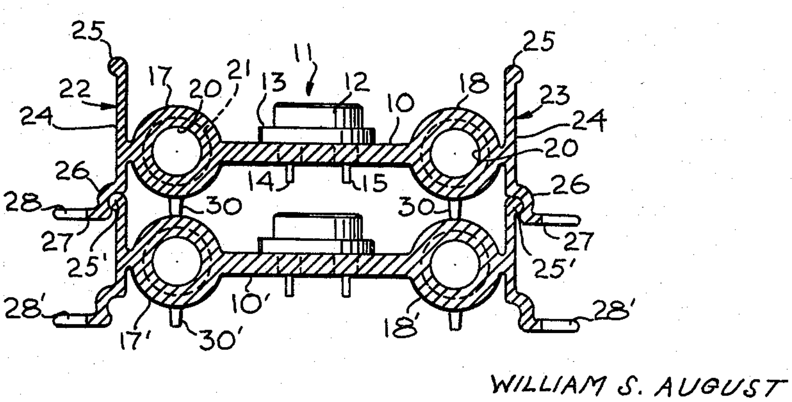
FIG. 3 is a sectional view taken on line 3—3 of FIG. 2 illustrating an embodiment including two mounting plates disposed in closely adjacent or "nesting" arrangement.

As illustrated particularly in FIG. 3, each of the hollow extensions 17, 18 is provided with a side plate 22, 23, respectively. The side plates 22 and 23 may be made integral with or may be secured to their respective hollow extensions. Each of the side plates 22, 23 has a vertical portion 24, an upper rounded termination 25, a lower curved portion 26 and a horizontal portion 27, portion 27 extending at right angles to the vertical portion 24. The horizontal portion 27 is provided with cut-outs 28.

As illustrated in FIG. 3, two of the mounting structures of the invention may be disposed in nesting relationship. The lower mounting structure illustrated is identical with the upper mounting structure and its elements are designated by the same reference numbers, primed. Thus it will be observed that the rounded extension 25′ of the lower mounting plate 10′ is received by the curved portion 26 of the upper mounting plate 10. Furthermore, each of the hollow extensions 17, 18 is provided with a downwardly extending projection or protuberance 30 which rests upon a lower extension 17′, 18′ to provide a more rigid support. The two structures 10 and 10′ may be slid into each other or the curved portions 26 may be forced over the rounded terminations 25′.

A tube 32 is fitted into the bores 21 of the two hollow extensions 17 and 18. The tube 32 may consist of any heat conducting material but preferably consists of aluminum. The tube 32 is secured to the bore 21 by a suitable sealing means such as an epoxy resin which is impervious to the liquid contained in the tube. It is essential that a liquid and vapor tight seal be provided between the tube 32 and the interior of extensions 17 and 18.

Two tubes 33 and 34 (which may have a smaller outer diameter than the tube 32) are respectively fitted into the bores 20 of the extensions 17 and 18. The tubes 33 and 34 may be constructed of the same heat-conducting material as the tube 32 and may be sealed or fastened with epoxy resin. The tubes 33 and 34 extend above the structure 10, as clearly shown in FIGS. 2 and 4, and may be joined together as by the pieces 43 and 43′. Each piece 43 may be advantageously fitted with a filler cap 35 having a hexagonal threaded cover 36 and a nylon washer 37. By removing the cover 36, the tubes may be filled with a suitable material. Although the tube 32 is shown to be of larger diameter than the tubes 33 and 34 to hold a larger supply of liquid, it is also feasible to use tubes 32, 33 and 34 of equal diameter. In such a case bore 20 may extend all the way through the extensions 17 and 18.

Preferably, a portion of the tubes 33 and 34 extending above the mount 10 are provided with heat-conducting fins 40. The fins 40 may consist of a heat conducting ribbon helically wound about the tubes 33 and 34 and secured thereto at one extremity of the ribbon's width. This may be effected by first winding the ribbon 40 on edge with a spacer wire between the convolutions of the ribbon, soldering both wire and ribbon and removing the wire. Alternatively, the fins 40 may be formed by machining on a metal working lathe.

Figure 2:
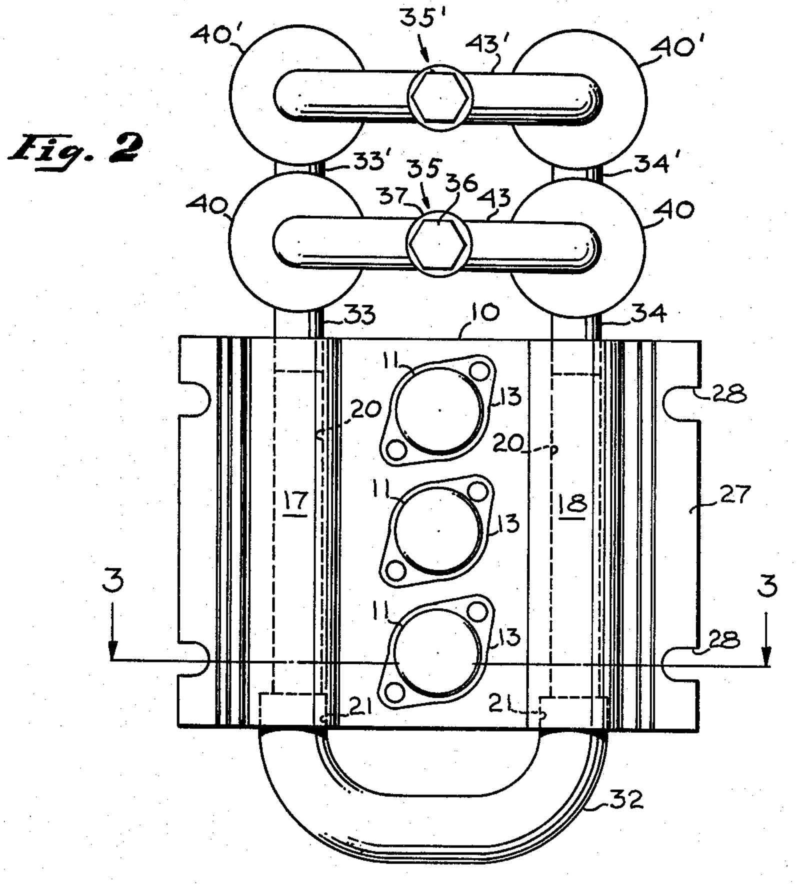
FIG. 2 is a plan view of the structure of FIG. 1.

It will be noted from an inspection of FIG. 4 that the tube 33 has a relatively short bend 41 interconnecting the hollow extension 18 and the heat exchanger tube 40. The tube 33′ has a larger bend 41′ so that the heat exchanger tube 40′ may be disposed side-by-side with the heat exchanger tube 40 when a number of mounting structures 10 are stacked together.

Thus, the two mounting structures 10 and 10′ may be slid into each other by first disposing the heat exchanger tubes 40 and 40′ away from each other and then sliding the circular termination 25′ into the bend 26 until the finned tubes 40 and 40′ are disposed side-by-side as shown in FIG. 4. It will also be understood that more than two structures may be disposed in nested relationship as long as the bends of the tubes 33 and 34 of the additional mounts are sufficiently long so as to dispose the various finned tubes such as 40 and 40′ in non-interfering relationship. Other shapes of tubes 40 and 40′ may be provided to fit the situation encountered.

The chamber formed by the hollow extensions 17 and 18, interconnecting tube 32, and the tubes 33 and 34 is filled through the filler cap 36 with a suitable material such as Freon which may be chosen to be liquid at room temperature and become vaporous at the operating temperature of the transistors 11. Many liquids will be suitable for this purpose. For example, various Freon compounds of different boiling points are available such as Trichloromonofluoromethane (74.8° F.), Trichlorotrifluoroethane (117.6° F.) and others. Further, the chamber may be sealed to maintain a selected pressure. Since the temperature at which a liquid vaporizes depends to a large extent on the pressure of the liquid, the vaporizing temperature may be adjusted to be approximately at practically any desired operating temperature. It should be understood that liquids which comprise two or more basic liquids, one of which vaporizes at a lower temperature than the other, may be utilized in accordance with this invention by selecting the lower-vaporizing liquid to have an appropriate vaporizing temperature. The last-mentioned liquid will then vaporize at operating temperatures to conduct heat away from the plate while the other basic liquid will remain adjacent the plate to provide a conduit for dissipating additional heat.

As a transistor 11 is operated, its temperature increases and the resulting heat is coupled by the mounting plate 10 into the liquid in the tube system. Eventually the liquid in the chamber vaporizes, and the vapor rises into the finned tube 40. There, by heat exchange with the atmosphere, the vapor condenses, and the liquid runs back by action of gravity into the hollow extensions 17 and 18. As a result, the temperature of the transistors 11 can not far exceed the temperature at which the liquid in the tube system vaporizes. The sizes and inner diameters of connecting tube 32 and of extensions 17 and 18 primarily determine the amount of liquid the system will hold.

It will be noted that the cooling action does not require any power for driving pumps, fans or the like. Accordingly, the finned tubes 40, 40′ should be designed to carry away all the heat the transistors or other semiconductors disposed on the heat dissipating mount are expected to generate.

It will be noted from an inspection of FIG. 3 that the space between mounting plates 10 and 10′ is sufficient to permit mounting a transistor or similar semiconductor device therebetween. Also other electric components such as resistors, capacitors or inductors may be mounted in the remaining space between the plates 10 and 10′ and in the apertures 28 and 28′. The space between the tabs 27 and 27′ is also available for this purpose. The area of the mounting plate 10 may be so designed as to mount the desired number of semiconductor devices.

Although there has been described above a specific arrangement of a heat-dissipating semiconductor mount in accordance with the invention for the purpose of illustrating the manner in which the invention may be used to advantage, it will be appreciated that the invention is not limited thereto. Accordingly, any and all modifications, variations or equivalent arrangements falling within the scope of the annexed claims should be considered to be a part of the invention.

What is claimed is:

1. A mounting structure adapted to support semiconductor devices and to dissipate the heat generated by the operation thereof, comprising at least two support plates, each of said support plates being adapted to support a semiconductor device; two substantially-parallel hollow extensions thermally coupled to each of said support plates adjacent the device supported thereon; hollow tubes individually associated with each of said plates and interconnecting the open ends of said extensions associated therewith to form a closed liquid-vapor system, said tubes including a portion disposed above said support plates; a material disposed in said tubes and extensions at a pressure so as to be liquid at room temperatures and to be a vapor at the operating temperature of the semiconductor device whereby any vapor of said material tends to collect in said tube portions and is condensed by heat exchange with the atmosphere; an individual side member secured to each of said hollow extensions associated with each of said support plates, means on said side members for interlocking the side members of adjacent ones of said plates, and a protuberance projecting from each of said extensions to engage the extensions associated with the adjacent plate.

2. A mounting structure adapted to support semiconductor devices and to dissipate heat generated by the operation thereof comprising at least two support plates, each of said support plates being adapted to support a semiconductor device and having two substantially-parallel hollow extensions disposed symmetrically about the device, each of said support plates having a side member secured to one of its hollow extensions, and means on said side members for interlocking the side members of adjacent ones of said plates; hollow tubes interconnecting the open ends of the extensions of each of said plates to form a closed liquid-vapor system, said tubes including a portion having heat-dissipating fins disposed above said support plates; and a vaporizable material disposed in said tubes and extensions at a pressure so as to be liquid at room temperatures and to become a vapor at the operating temperature of the semiconductor device whereby vapor tends to collect in said finned tube portions and is condensed by heat exchange with the atmosphere.

3. A mounting structure adapted to support semiconductor devices and to dissipate the heat generated by the operation thereof comprising at least two support plates, each of said support plates being adapted to support a semiconductor device and having two substantially-parallel hollow extensions disposed symmetrically about the device, each of said support plates having a side member secured to one of its hollow extensions, means on both ends of said side members for interlocking the side members of adjacent ones of said plates, and a protuberance projecting from each of said extensions to engage the extensions of the adjacent plate; hollow tubes interconnecting the open ends of the extensions of each of said plates to form a closed liquid-vapor system, said tubes including a portion having heat-dissipating fins disposed above said support plates; and a material disposed in said tubes and extensions at a pressure so as to be liquid at temperatures below the operating temperature of the semiconductor device and to be a vapor at the operating temperature of the semiconductor device whereby any vapor of said material tends to collect in said finned tube portions and is condensed by heat exchange with the ambient atmosphere.

References Cited in the file of this patent

UNITED STATES PATENTS

| | | |
|---|---|---|
| 2,958,021 | Cornelison et al. | Oct. 25, 1960 |
| 3,024,298 | Goltsos et al. | Mar. 6, 1962 |
| 3,035,419 | Wigert | May 22, 1962 |